United States Patent [19]
Takaishi

[11] Patent Number: 5,689,126
[45] Date of Patent: Nov. 18, 1997

[54] SEMICONDUCTOR MEMORY DEVICE HAVING STACKED CAPACITOR

[75] Inventor: Yoshihiro Takaishi, Tokyo, Japan

[73] Assignee: NEC Corporation, Japan

[21] Appl. No.: 499,038

[22] Filed: Jul. 6, 1995

[30] Foreign Application Priority Data

Jul. 7, 1994 [JP] Japan ............................ 6-177734

[51] Int. Cl.[6] .................. H01L 27/108; H01L 29/76; H01L 29/94; H01L 31/119
[52] U.S. Cl. ............................. 257/306; 257/310
[58] Field of Search ........................ 257/296, 306, 257/310

[56] References Cited

U.S. PATENT DOCUMENTS 5,361,234  11/1994  Iwasa ............................ 257/296
5,432,732  7/1995   Ohmi ............................. 365/149

OTHER PUBLICATIONS

T. Kikkawa, "Quarter–Micron Interconnection Technology for 256M DRAMs", International Conference on Solid State Devices and Materials, pp. 90–92, 1992 no month.

*Primary Examiner*—Stephen Meier
*Attorney, Agent, or Firm*—Hayes, Soloway, Hennessey, Grossman & Hage, P.C.

[57] ABSTRACT

In a stacked capacitor for a DRAM cell, including a lower electrode layer, an upper electrode layer and an insulating layer therebetween, at least two insulating layers are formed on the upper electrode layer, and a wiring layer is formed on the two insulating layers. The upper electrode layer is connected via a contact hole perforated in the two insulating layers to the wiring layer.

10 Claims, 12 Drawing Sheets

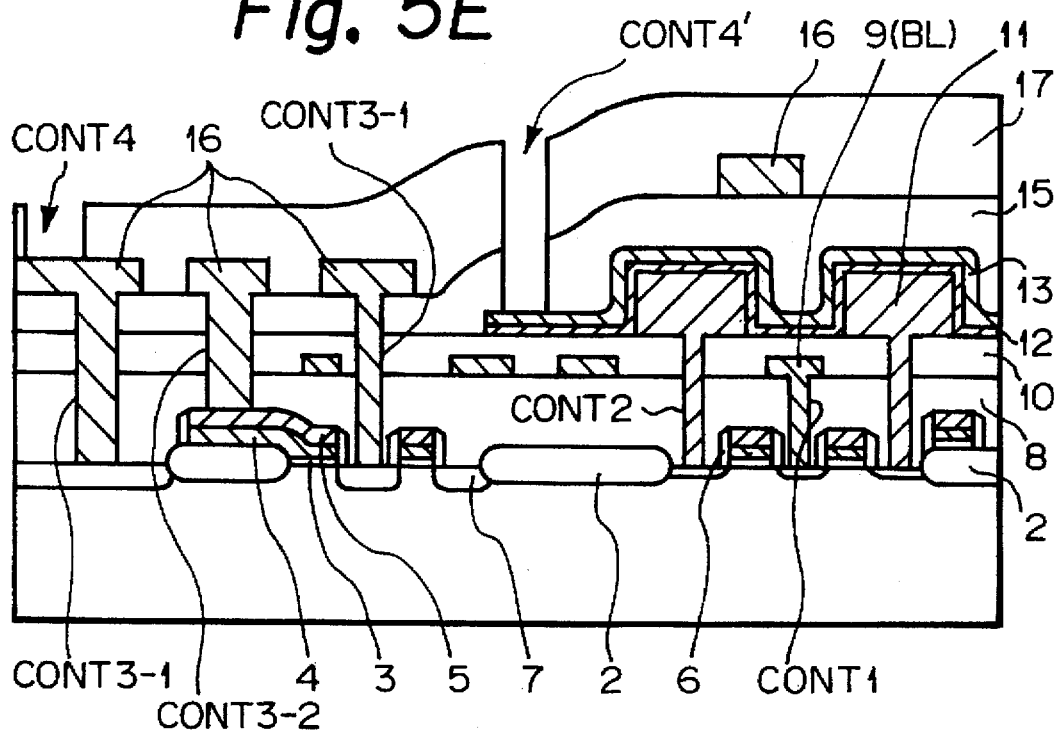
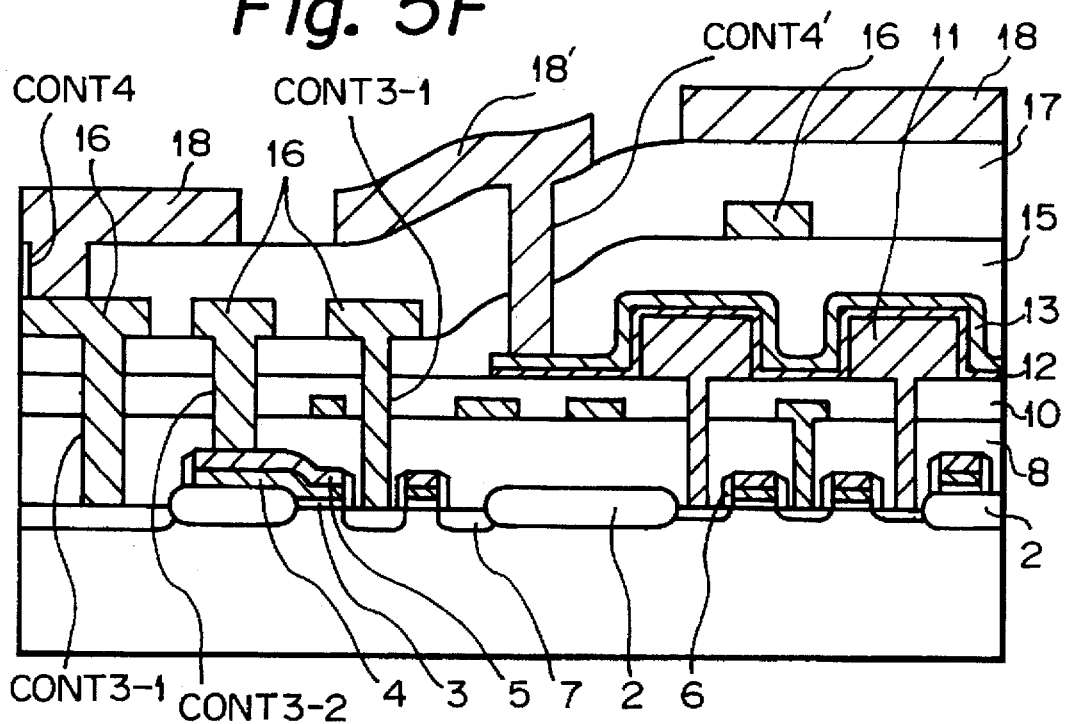

SEMICONDUCTOR MEMORY DEVICE HAVING STACKED CAPACITOR

BACKGROUND OF THE INVENTION

1. Field of the Invention

The present invention relates to a stacked capacitor used in a memory cell of a dynamic random access memory (DRAM).

2. Description of The Related Art

Generally, in a DRAM, each memory cell is constructed by a MOS transistor and a capacitor. A stacked capacitor, which has lower and upper electrodes and an insulating layer therebetween, has been used as such a capacitor, to thereby enhance the integration of the DRAM.

In a prior art stacked capacitor (see: T. Kittawa, "Quarter-Micron Interconnection Technology for 256M DRAMS", International Conference on Solid State Devices and Materials, pp. 90–92, 1992), the capacitor insulating layer is made of high permittivity material such as tantalum oxide ($Ta_2O_5$), and the capacitor upper electrode is made of high melting temperature metal such as titanium nitride (TiN) and blanket material such as WSi on the high melting temperature material. In this case, the high melting temperature material such as TiN is indispensable to obtain good contact characteristics to the high permittivity material. Also, an insulating layer is formed on the upper electrode, and a wiring layer is formed on the insulating layer. The upper electrode layer is connected via a contact hole to the wiring layer. In this case, in order to reduce a contact resistance between a silicon surface and a contact metal, a heat operation is required after the formation of the high melting temperature metal, the Ti component of the high melting temperature metal TiN is diffused. Therefore, the blanket material such as WSi is indispensable to prevent the other portions of a device from being contaminated by Ti. This will be explained later in detail.

In the above-described prior art stacked capacitor using high permittivity material, however, since the capacitor upper electrode has a double layer configuration, the integration of the DRAM device is reduced.

SUMMARY OF THE INVENTION

It is an object of the present invention to provide a highly integrated DRAM.

According to the present invention, in a stacked capacitor for a DRAM cell, including a lower electrode layer, an upper electrode layer and an insulating layer therebetween, at least two insulating layers are formed on the upper electrode layer, and a wiring layer is formed on the two insulating layers. The upper electrode layer is connected via a contact hole perforated in the two insulating layers to the wiring layer.

Thus, since a heat operation and the like are unnecessary after the formation of such a contact hole, the capacitor upper electrode can be made of a single layer without the blanket material thereof. This enhances the integration of the DRAM.

BRIEF DESCRIPTION OF THE DRAWINGS

The present invention will be more clearly understood from the description as set forth below, as compared with the prior art with reference to the accompanying drawings, wherein:

FIGS. 5A through 5F are cross-sectional views for explaining a method for manufacturing the DRAM of FIGS. 3 and 4;

DESCRIPTION OF THE PREFERRED EMBODIMENTS

Figure 1:
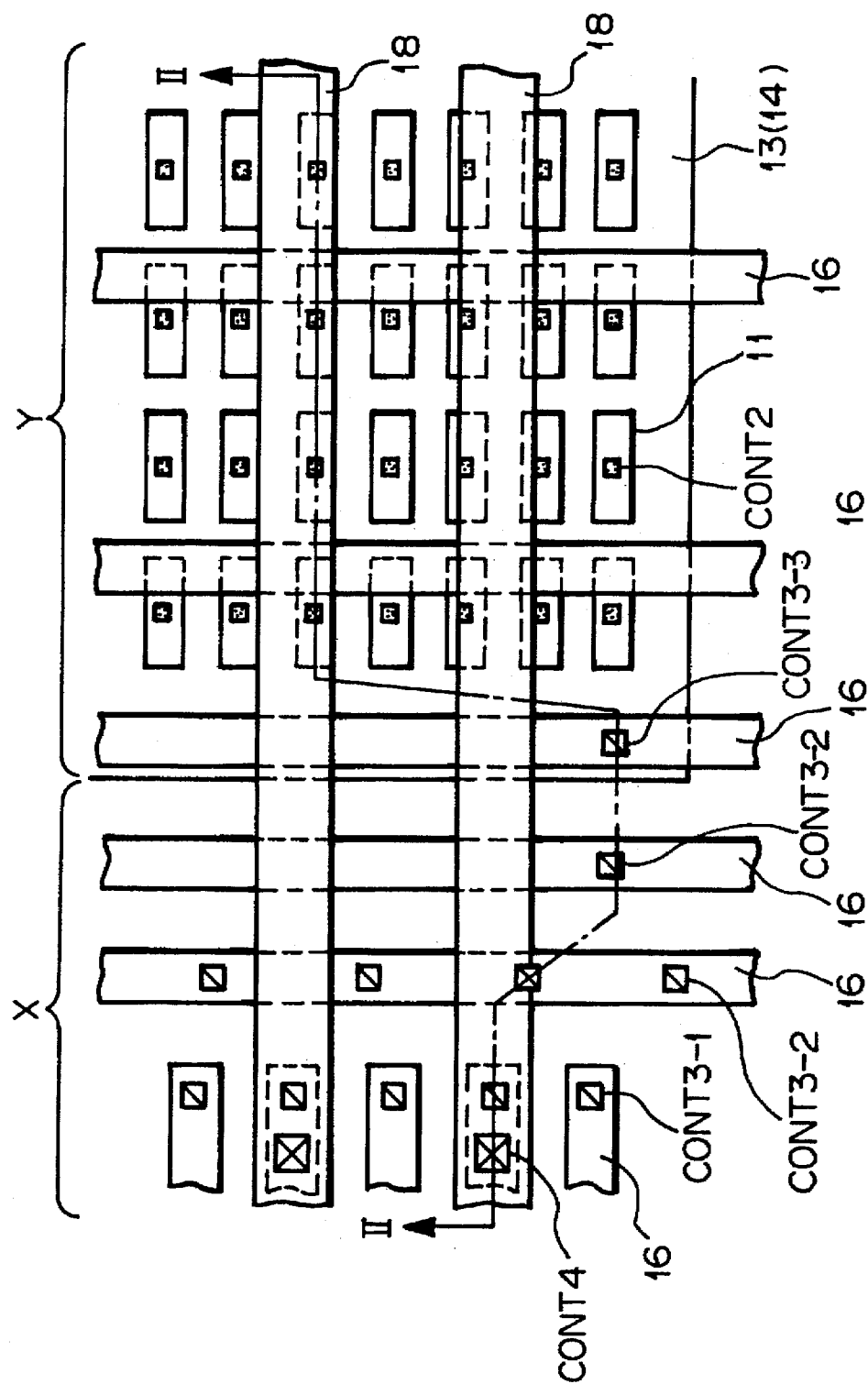
FIG. 1 is a plan view illustrating a prior art DRAM.
Figure 2:
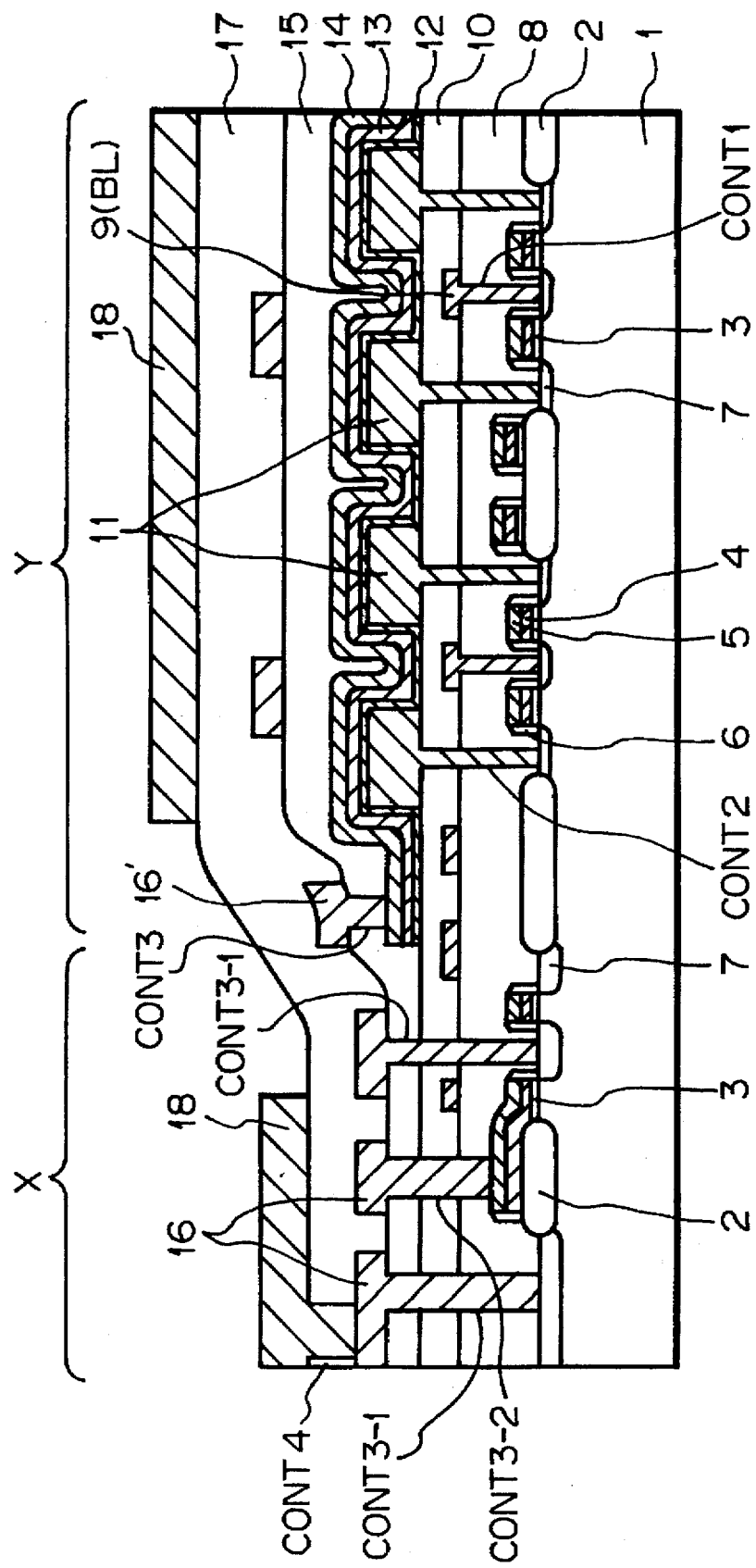
FIG. 2 is a cross-sectional view taken along the line II—II of FIG. 1.

Before the description of the preferred embodiments, a prior art DRAM will be explained with reference to FIGS. 1 and 2 (see: T. Kikkawa, "Quarter-Micron Interconnection Technology for 256M DRAMs", International Conference on Solid State Devices and Materials, pp. 90–92, 1992). In FIGS. 1 and 2, reference X designates a peripheral circuit area including a decoder, a sense amplifier, and Y designates a memory cell array area.

Formed on a P-type monocrystalline silicon substrate 1 is a thick field silicon oxide layer 2 and a thin gate silicon oxide layer 3. Also, formed on the gate silicon oxide layer 3 is a gate electrode formed by a polycrystalline silicon layer 4 and a titanium silicide layer 5. Further, sidewall silicon oxide layers 6 are formed on sidewalls of the gate electrode (4, 5), and N-type impurity doped regions 7 serving as source/drain regions are formed within the silicon substrate 1 on both sides of the gate electrodes (4, 5). The sidewall silicon oxide layers 6 are used for a lightly doped drain (LDD) configuration.

An insulating layer 8 is formed entirely on the surface. Also, contact holes CONT1 are perforated in the insulating layer 8, and metal wiring layers 9 serving as bit lines BL are connected via the contact holes CONT1 to the impurity doped regions 7.

An insulating layer 10 is formed entirely on the surface. Also, contact holes CONT2 are perforated in the insulating layer 10, and capacitor lower electrodes 11 made of polycrystalline silicon or the like are connected via the contact holes CONT2 to the impurity doped regions 7.

A capacitor insulating layer 12 made of high permittivity material such as $Ta_2O_5$ is formed on the capacitor lower electrodes 11. The high permittivity material can remarkably increase the capacitance of the capacitors.

Formed on the capacitor insulating layer 12 are a capacitor upper electrode including a high melting temperature metal layer 13 made of TiN or the like and a blanket layer 14 made of WSi or the like. The high melting temperature metal layer 13 and the blanket layer 14 will be explained later in detail.

Also, an insulating layer 15 is formed entirely on the surface. Also, contact holes CONT3-1, 3-2 and 3-3 are perforated in the insulating layer 15, and metal wiring layers 16 and 16' are connected via the contact holes CONT3-1, 3-2 and 3-3 to the impurity doped regions 7, the gate electrodes (4, 5) of the peripheral circuit area X, and the capacitor upper electrode (13, 14), respectively.

Further, an insulating layer 17 is formed entirely on the surface. Also, contact holes CONT4 are perforated in the insulating layer 17, and metal wiring layers 18 are connected via the contact holes CONT4 to the metal wiring layers 16.

If polycrystalline silicon as a capacitor upper electrode is adhered to the capacitor insulating layer 12 made of $Ta_2O_5$, Si atoms are diffused into the capacitor insulating layer 12, to deteriorate it. Therefore, it is impossible to use polycrystalline silicon as a capacitor upper electrode. Therefore, high melting temperature metal such as TiN is used as a capacitor upper electrode, since such metal has excellent contact characteristics to the high permittivity material, and hardly reacts with it.

However, it is impossible to form the capacitor upper electrode by a single TiN layer. That is, after the formation of the contact holes CONT3-1, CONT3-2 and CONT3-3 before the formation of the metal wiring layers 16 and 16', in order to reduce the contact resistance at an interface between the metal wiring layer 16 and the impurity doped regions 7, a cleaning process by buffered fluorine acid, an ion implantation process and a heating process have to be carried out. As a result, the single TiN layer is overetched by the fluorine acid during in the cleaning process since the contact hole CONT3-3 is shallower than the contact holes CONT3-1 and CONT3-2, i.e., the thickness of the insulating layer on the capacitor upper electrode (13, 14) is thinner that of the insulating layer on the gate electrode (4, 5). Therefore, the single TiN layer has to be sufficiently thick, for example, about 300 nm thick. Also, a Ti component is evaporated in the heating process, so that a furnace and wafers therein are contaminated by the evaporated Ti component. Therefore, the blanket layer 14 made of WSi on the like is indispensable in the DRAM of FIGS. 1 and 2.

Figure 3:
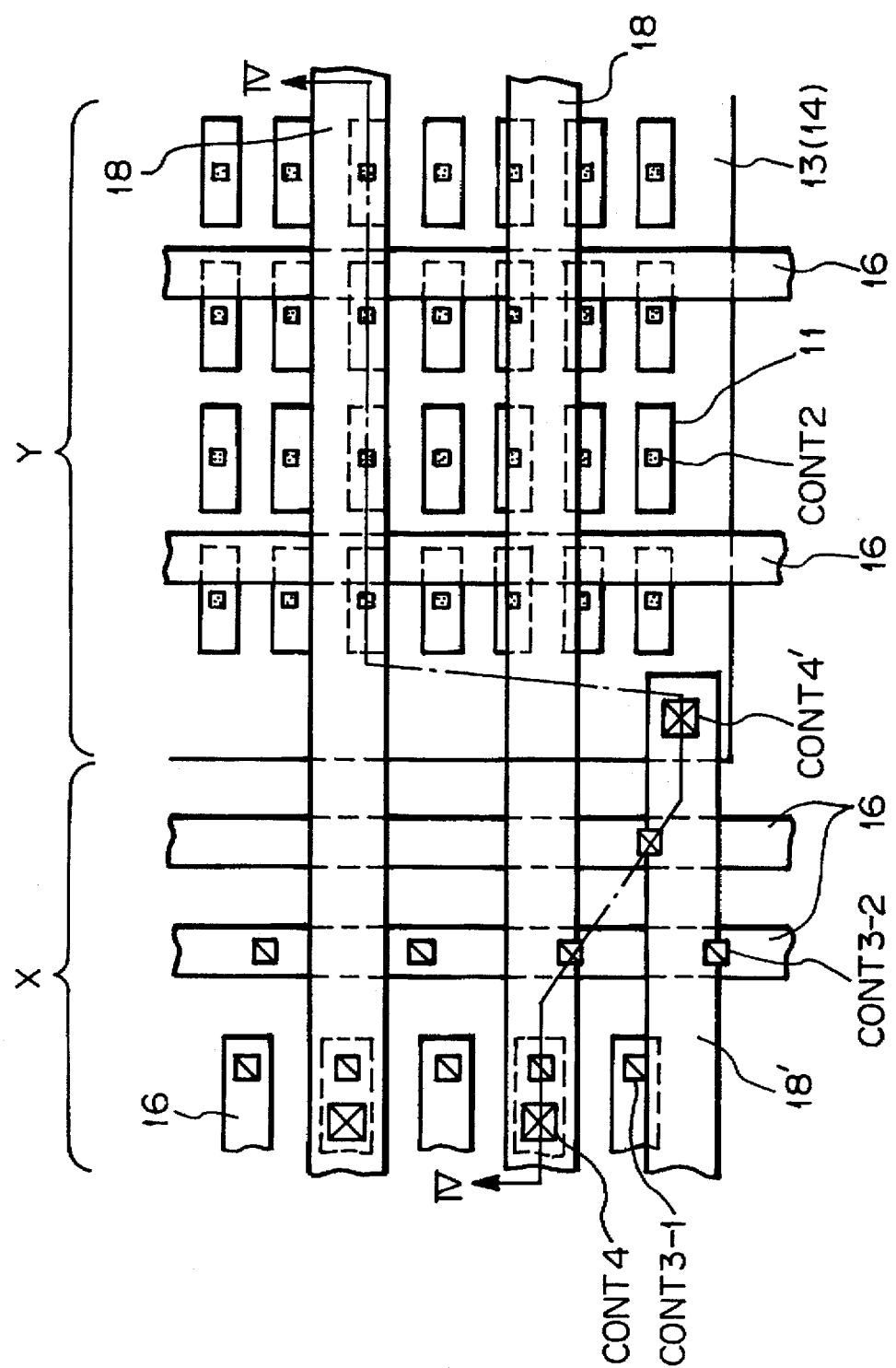
FIG. 3 is a plan view illustrating a first embodiment of the DRAM according to the present invention.
Figure 4:
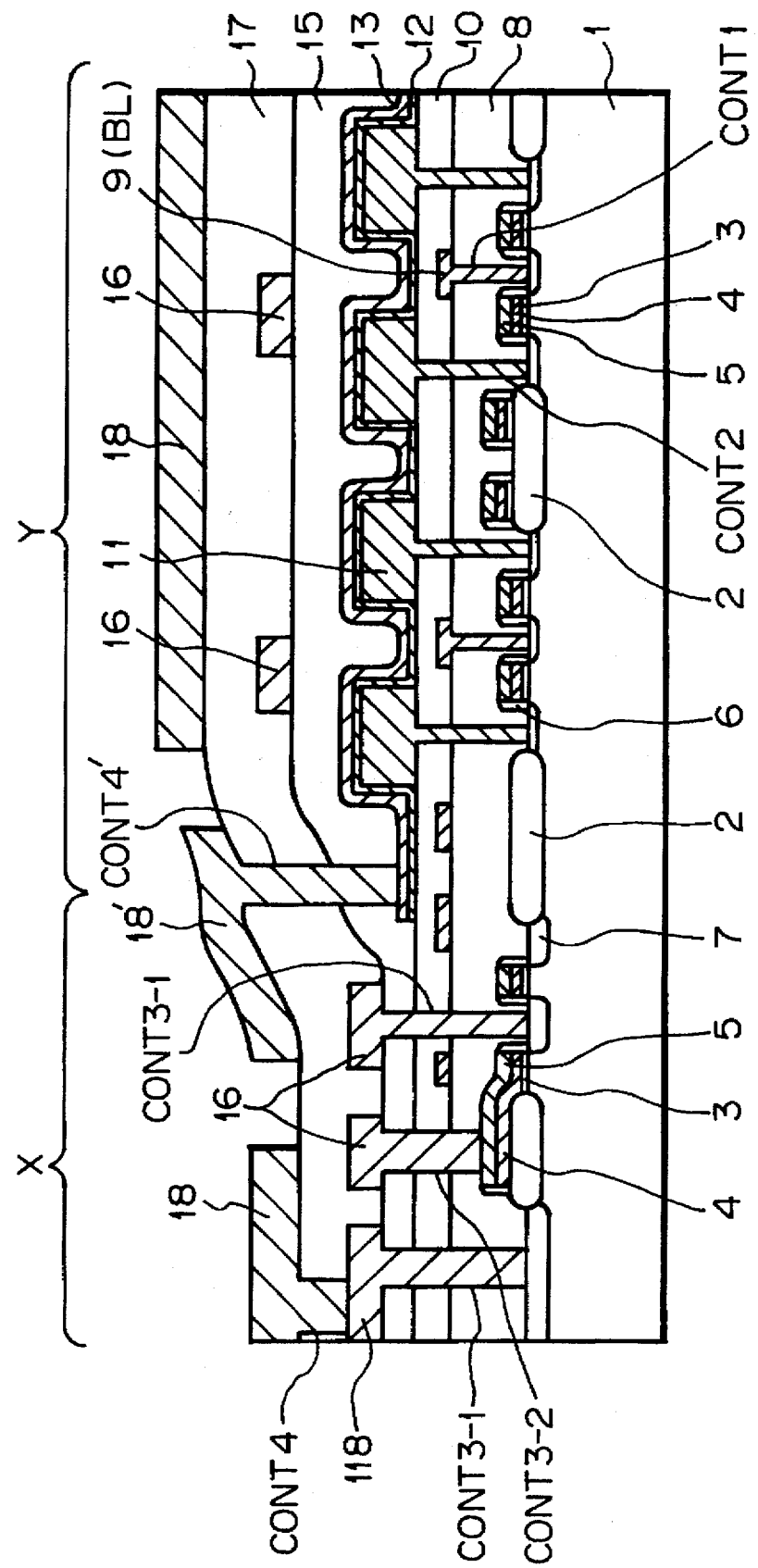
FIG. 4 is a cross-sectional view taken along the line IV—IV of FIG. 3.

In FIGS. 3 and 4, which illustrate a first embodiment of the present invention, the capacitor upper electrode is made of a single layer, i.e., the high melting temperature metal layer (TiN) 13. Also, the capacitor upper electrode 13 is connected via a contact hole CONT4' to a metal wiring layer 18'. Note that the contact hole CONT4' is formed simultaneously with the contact hole CONT4, and the metal wiring layer 18 is formed simultaneously with the metal wiring layer 18.

Thus, after the formation of the contact holes CONT4 and CONT4' before the formation of the metal wiring layers 18 and 18', the above-described cleaning process by fluorine acid, the ion implantation process and the heating process are unnecessary, since there is no more interface between semiconductor and metal. Therefore, the blanket layer 14 of FIGS. 1 and 2 is also unnecessary.

The manufacture of the DRAM of FIGS. 3 and 4 is explained next with reference to FIGS. 5A through 5F.

Figure 5A:
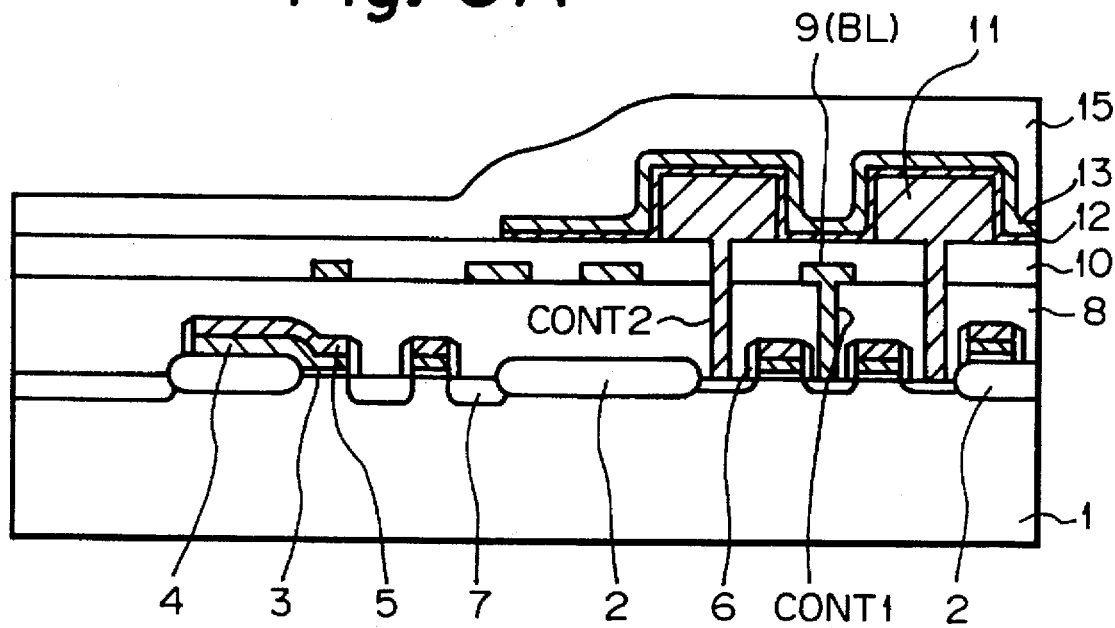

First, referring to FIG. 5A, a local oxidation of silicon (LOCOS) is performed upon a monocrystalline silicon substrate 1 with a mask of silicon nitride (not shown) to create a thick field silicon oxide layer 2. Next, a thin gate silicon oxide layer 3 is formed by thermally oxidizing the silicon substrate 1. Then, a polycrystalline silicon layer 4 and a titanium silicide layer 5 are deposited by a chemical vapor deposition (CVD) process and then patterned to form gate electrodes (4, 5). Then, N-type impurities such as phosphorus are ion-implanted into the silicon substrate 1 with a mask of the gate electrodes (4, 5), to create lightly doped N-type regions (not shown) for the LDD configuration. Then, sidewall silicon oxide layers 6 are formed on both sides of the gate electrodes (4, 5), and N-type impurities such as arsenic are ion-implanted into the silicon substrate 1 with a mask of the gate electrodes (4, 5) as well as the sidewall silicon oxide layers 6, to create highly doped N-type regions 7 for the LDD configuration.

Next, an insulating layer 8 is deposited by an CVD process, and contact holes CONT1 are perforated in the insulating layer 8. Then, metal wiring layers (i.e., the bit lines BL) 9 are deposited, so that the metal wiring layers 9 are connected via the contact holes CONT1 to the N-type impurity regions 7.

Next, an insulating layer 10 is deposited by a CVD process, and contact holes CONT2 are perforated in the insulating layer 10. Then, an about 500 nm thick polycrystalline silicon layer is deposited by a CVD process, and is patterned by a photolithography and dry etching process, to form capacitor lower electrodes 11. Then, an about 10 nm thick $Ta_2O_5$ layer, and an about 100 nm thick TiN layer are sequentially deposited by CVD processes, and are patterned by a photolithography and dry etching process, to form a capacitor insulating layer 12 made of $Ta_2O_5$ and a capacitor upper electrode 13 made of TiN. Then, an insulating layer 15 is deposited by a CVD process, and is flattened by a chemical mechanical polishing (CMP) or the like.

Figure 5B:
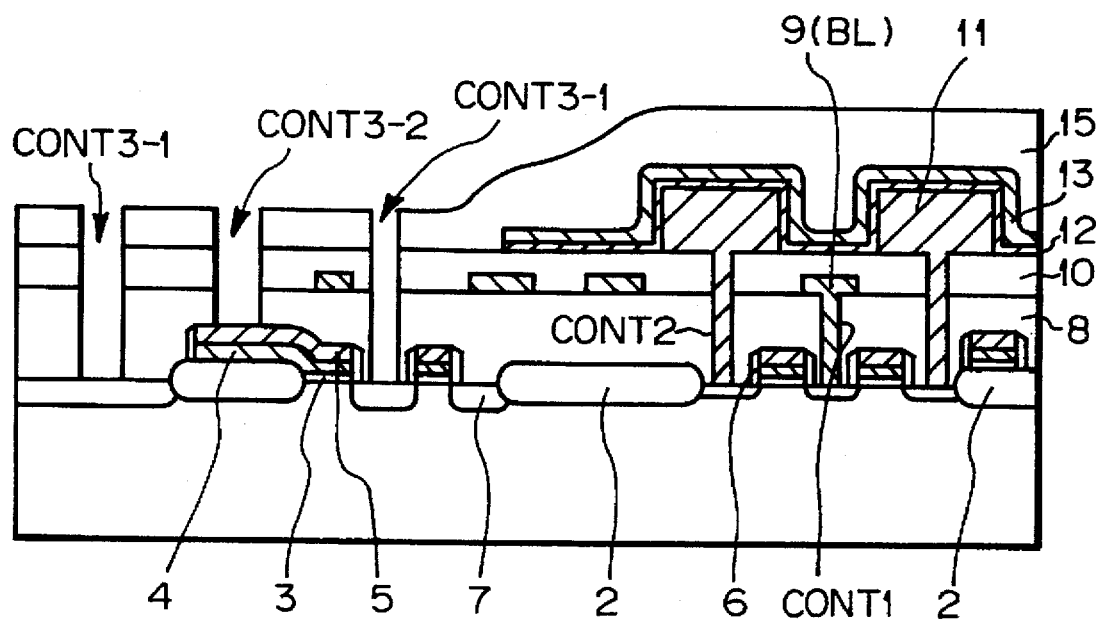

Next, referring to FIG. 5B, contact holes CONT3-1 and CONT 3-2 are perforated in the insulating layers 15, 10 and 8 by a photolithography and dry etching process. In this case, note that the contact hole CONT3-3 of FIGS. 1 and 2 is not perforated. Then, in order to reduce the contact resistance, a cleaning process by buffered fluorine acid, an ion-implation of N-type impurities and a heat process are carried out.

Figure 5C:
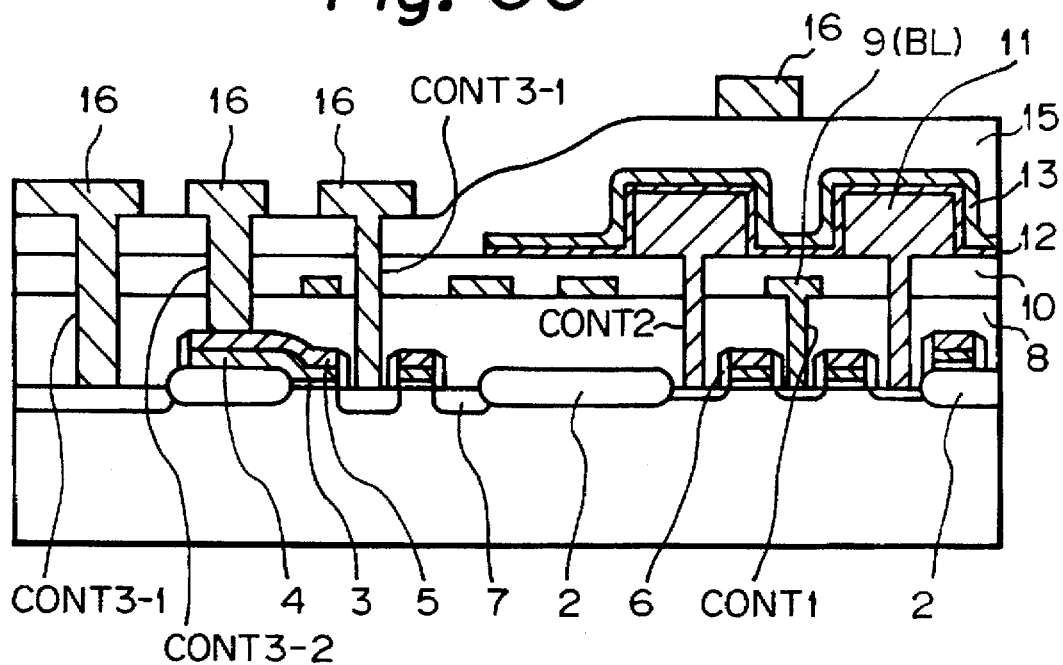

Next, referring to FIG. 5C, an aluminum (or its alloy) layer is deposited by a sputtering process, and is patterned to form metal wiring layers 16.

Figure 5D:
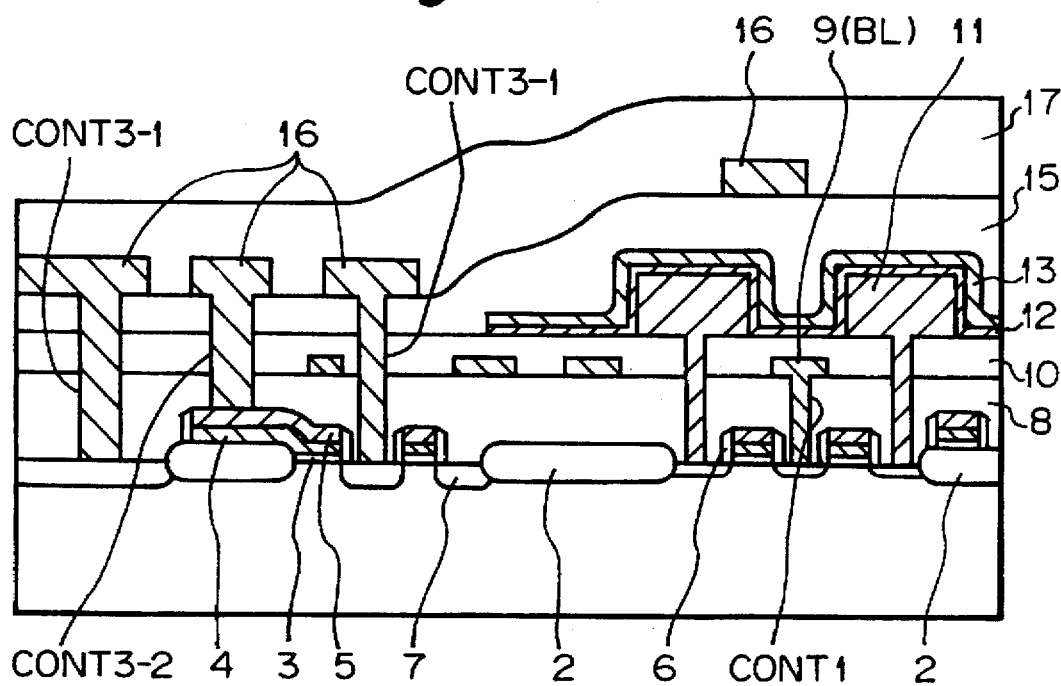

Next, referring to FIG. 5D, an insulating layer 17 is deposited by a CVD process, and is flattened by a CMP or the like.

Next, referring to FIG. 5E, a contact hole CONT4 is perforated in the insulating layer 17, and a contact hole CONT4' is perforated in the insulating layers 17 and 15. The contact holes CONT4 and CONT4' are simultaneously formed by a photolithography and dry etching process.

Finally, referring to FIG. 5F, an aluminum (or its alloy) layer is deposited by a sputtering process, and is patterned to form metal wiring layers 8 and 18'.

Thus, in the aluminum deposition process of the first embodiment, the heat operation after the ion implantation into the impurity doped regions for reducing the contact resistance at the interface between the metal and the impurity doped region as stated in the prior art is unnecessary, so that the WSi layer 14 on the TiN layer 13 is unnecessary. Moreover, since only the contact holes CONT4 and CONT4' are perforated simultaneously through the layers insulating 15 and 17 after the formation of the contact holes CONT3-1, CONT3-2 and CONT3-3, the TiN layer 13 is hardly overetched, so that the TiN layer 13 can be thin.

Figure 6:
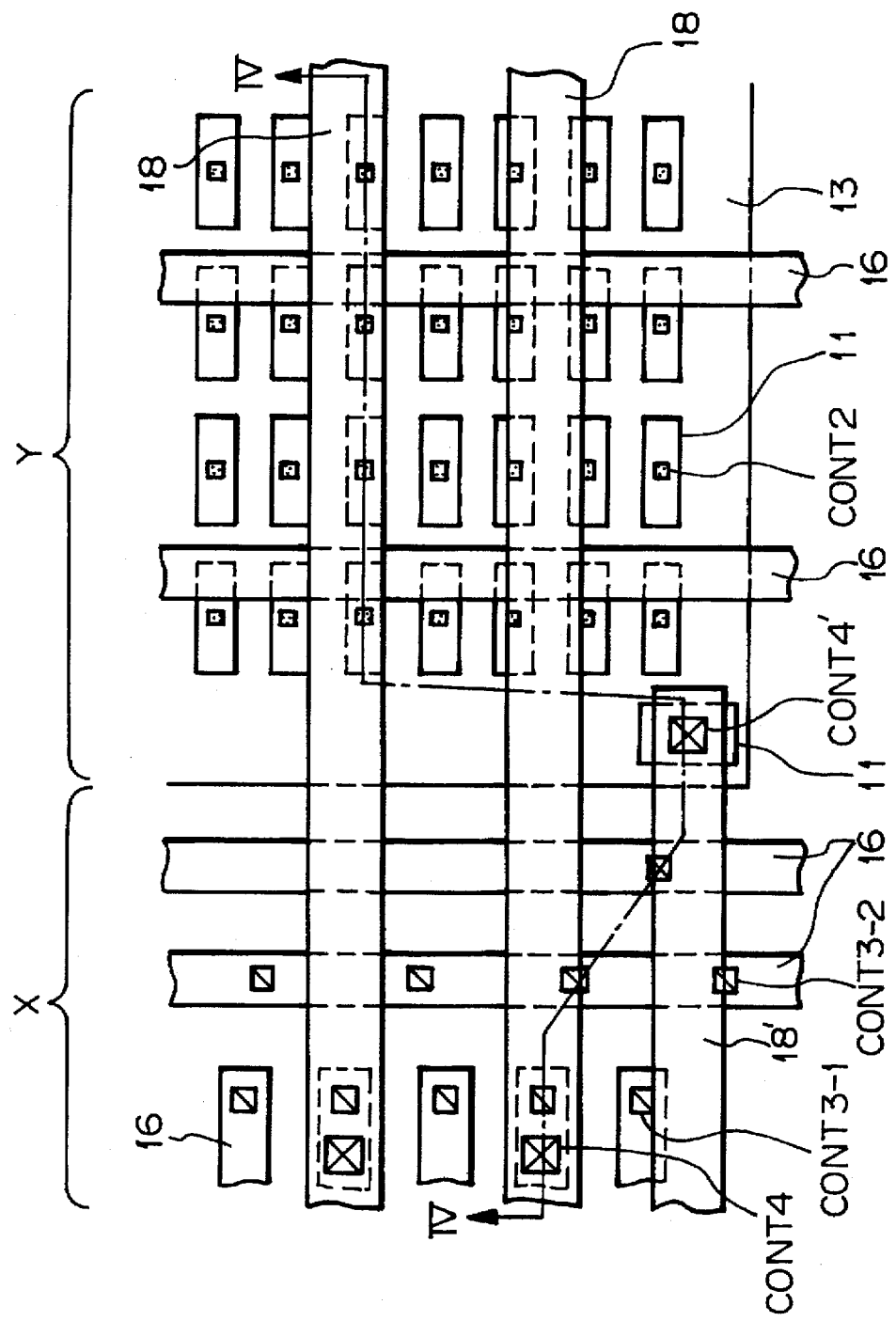
FIG. 6 is a plan view illustrating a second embodiment of the DRAM according to the present invention.
Figure 7:
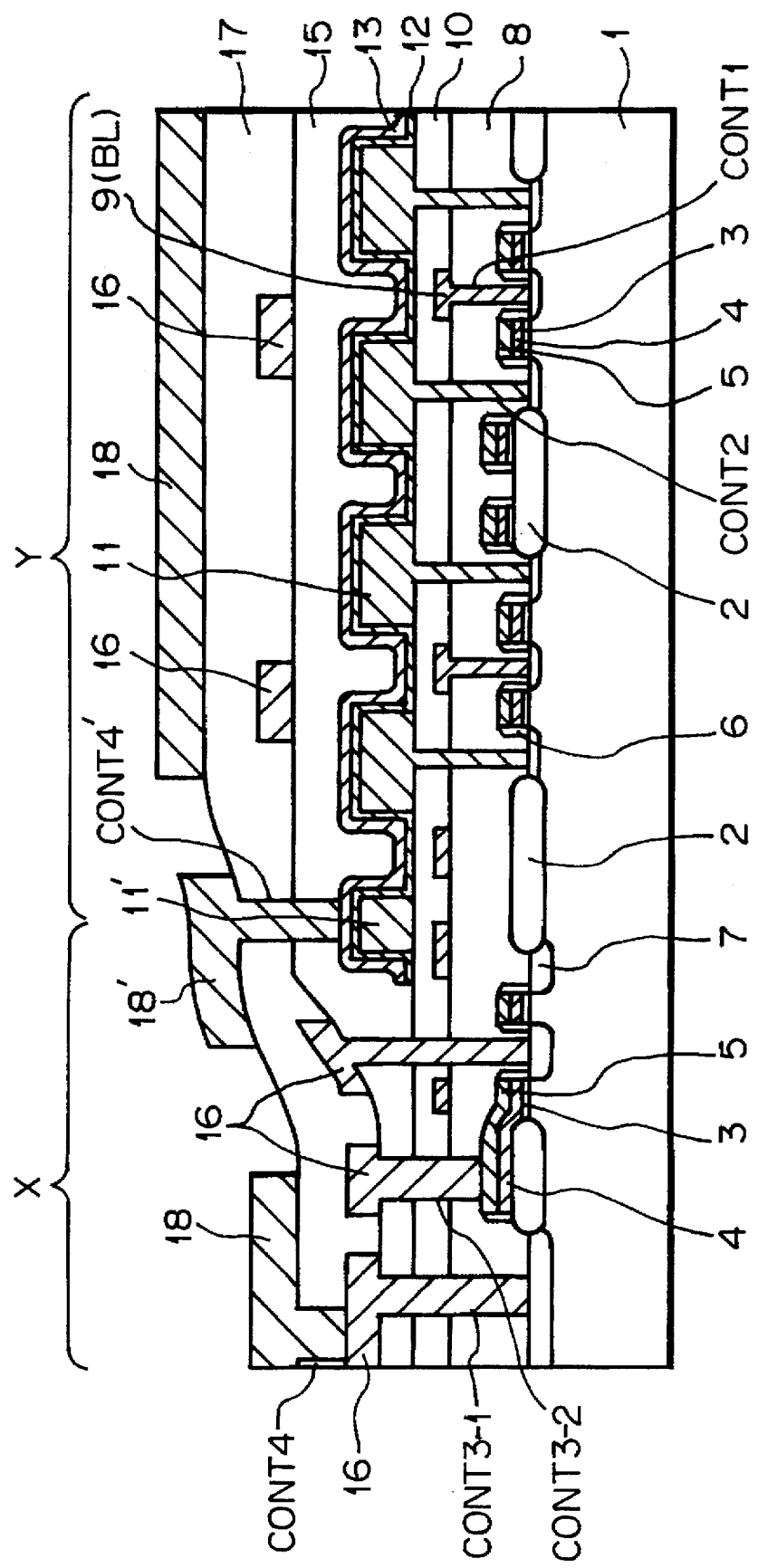
FIG. 7 is a cross-sectional view taken along the line VII—VII of FIG. 6.

In FIGS. 6 and 7, which illustrate a second embodiment of the present invention, a dummy capacitor lower electrode 11', which is formed simultaneously with the capacitor lower electrode 11, is provided beneath the contact hole CONT4'. Note that the dummy capacitor lower electrode 11' is not connected to any of the impurity doped regions 7.

The manufacture of the DRAM of FIGS. 6 and 7 is explained next with reference to FIGS. 8A through 8F.

Figure 8A:
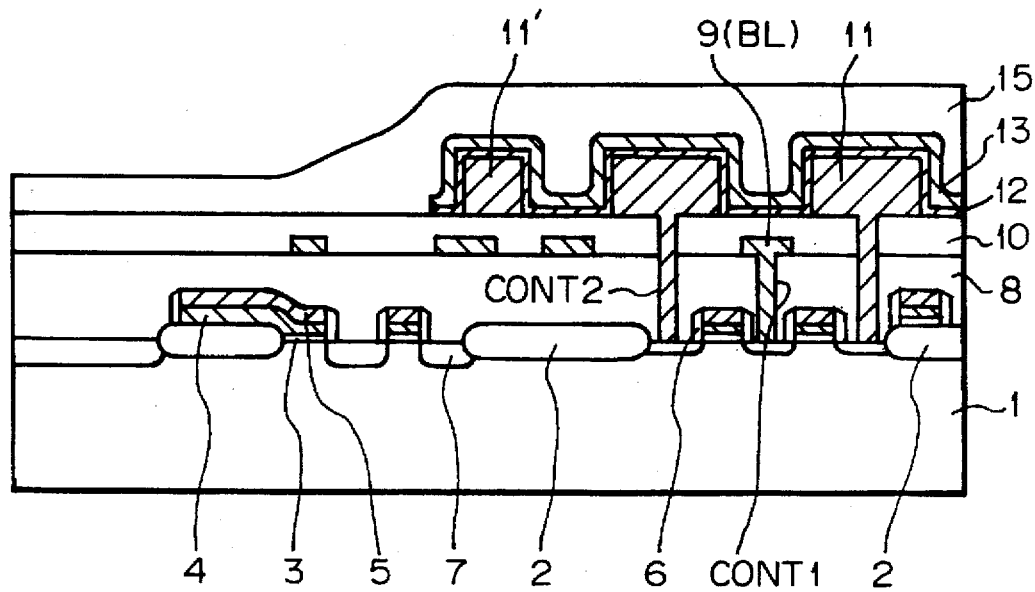
FIGS. 8A through 8F are cross-sectional views for explaining a method for manufacturing the DRAM of FIGS. 6 and 7.
Figure 8B:
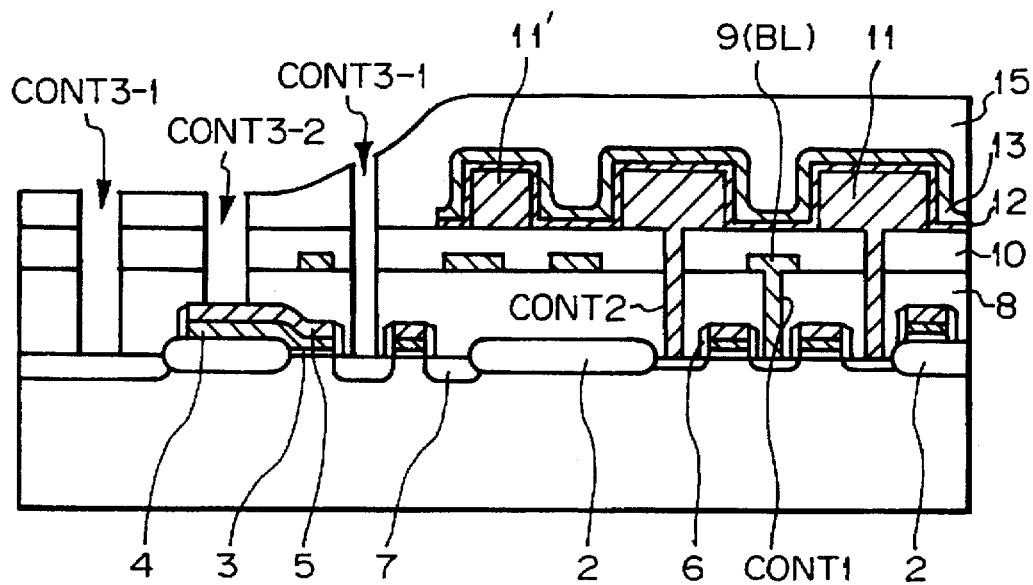
Figure 8C:
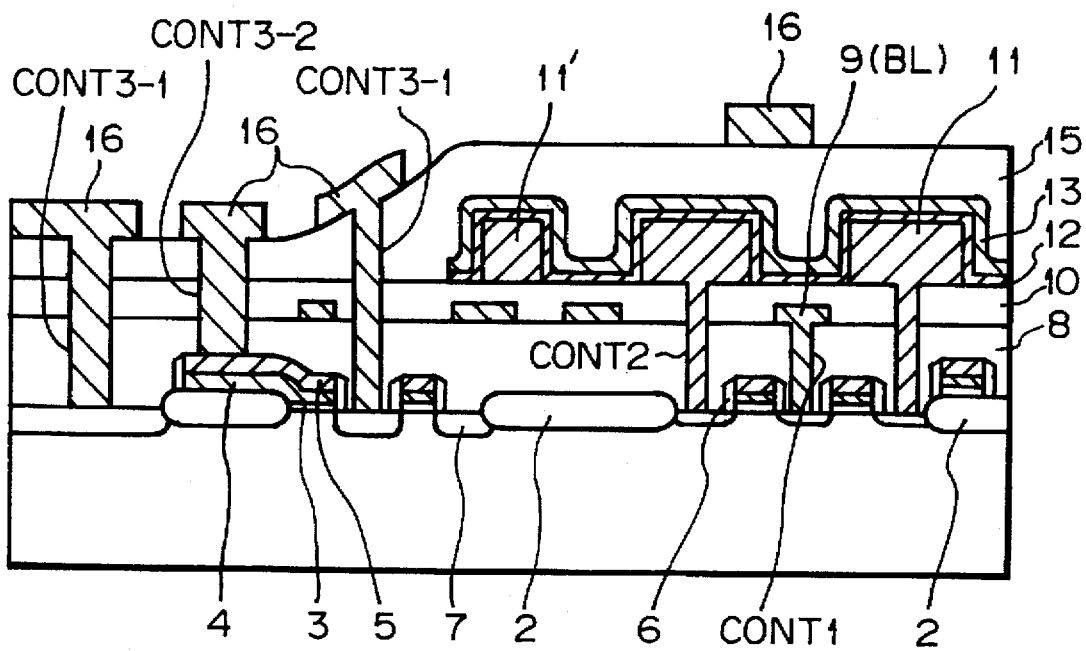
Figure 8D:
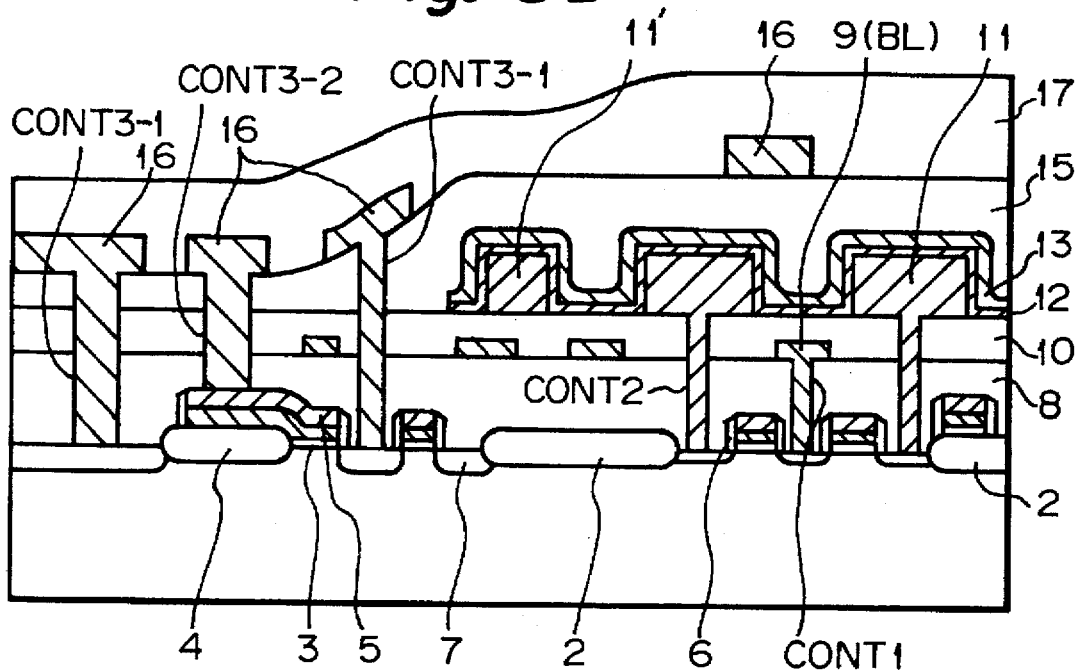
Figure 8E:
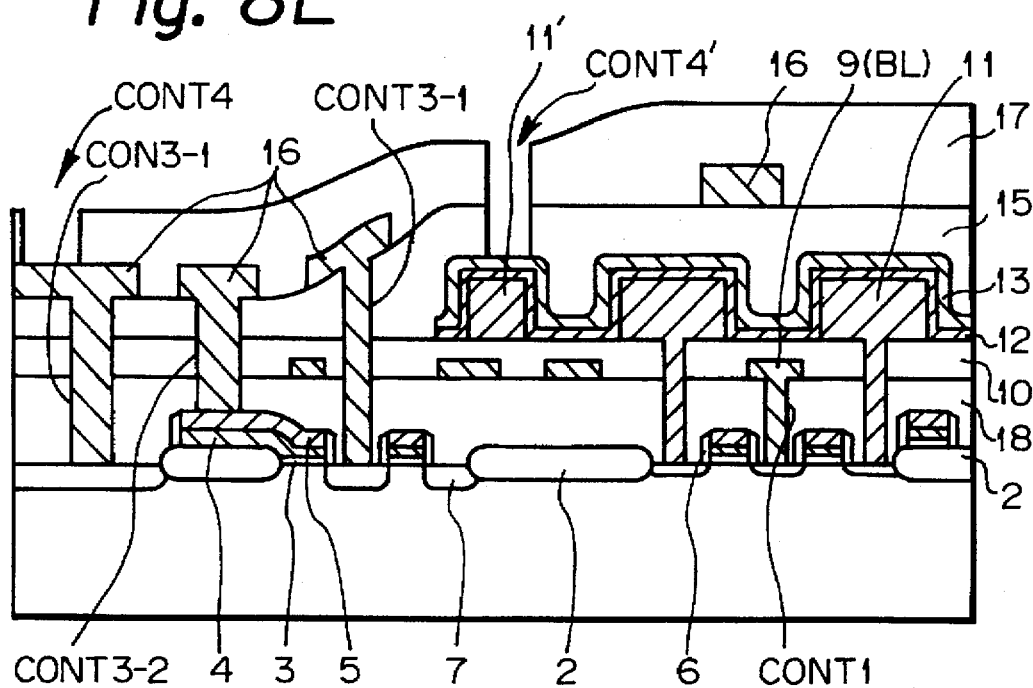
Figure 8F:
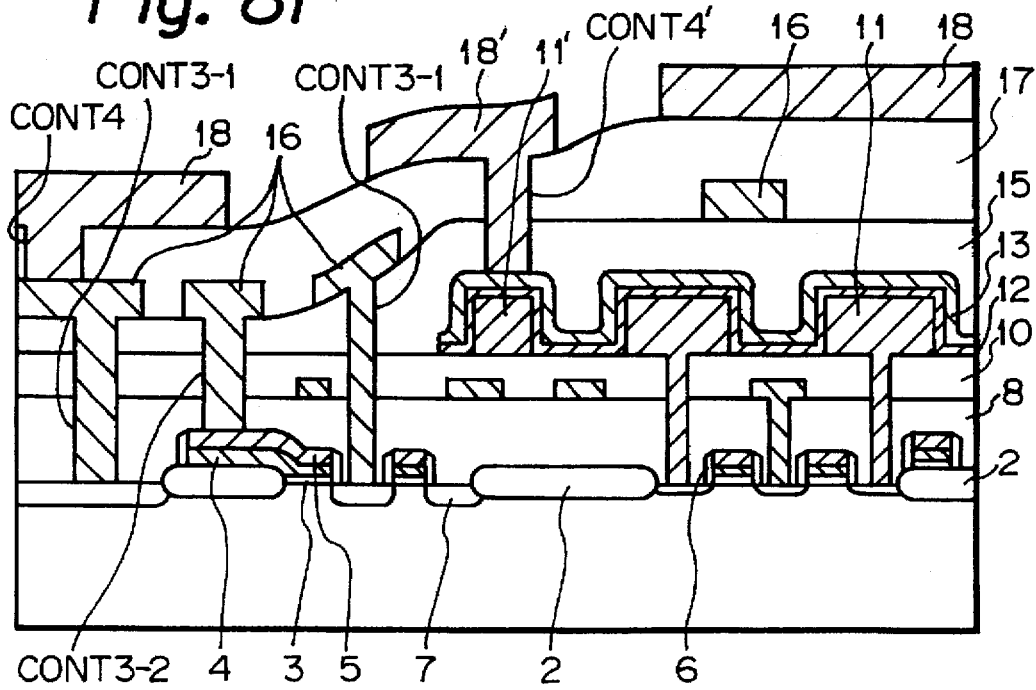

First, referring to FIG. 8A, the same processes as in FIG. 5A are carried out except that a dummy capacitor lower electrode 11' made of polycrystalline silicon is formed simultaneously with the formation of the capacitor lower electrode 11. Note that a contact hole CONT2 for the dummy capacitor lower electrode 11' is not formed.

Hereinafter, as shown in FIGS. 8B through 8F, the same processes as shown in FIGS. 5B through 5F are carried out, thus completing the DRAM of FIGS. 6 and 7.

Thus, in the second embodiment, the contact hole CONT4' is shallower than in the first embodiment, and therefore, the depth of the contact hole CONT4' is brought close to that of the contact hole CONT4. Therefore, the contact holes CONT4 and CONT4' can be more easily manufactured than in the first embodiment. Also, the metal wiring layers 18 and 18' can be more easily buried in the contact holes CONT4 and CONT4' than in the first embodiment.

Note that other high permittivity material such as barium strontium titan oxide (BST) and titanate zirconate (PZT) can be used as the capacitor insulating layer 12 instead of $Ta_2O_5$. Also, tungsten nitride (WN) or tungsten (W) can be used as the capacitor upper electrode 13 instead of TiN.

As explained hereinbefore, according to the present invention, since a capacitor upper electrode is connected via a contact hole perforated through at least two insulating layers, a heat operation or the like is not performed thereupon, so that the capacitor upper electrode can be made of a single layer, thus enhancing the integration of the DRAM.

I claim:

1. A stacked capacitor type semiconductor memory device comprising:

a semiconductor substrate;

first and second impurity doped regions formed within said semiconductor substrate;

a first insulating layer, formed on said semiconductor substrate and having a first contact hole leading to said second impurity doped region;

a capacitor lower electrode layer, formed on said first insulating layer and connected via said first contact hole to said second impurity doped region;

a capacitor insulating layer formed on said capacitor lower electrode layer;

a capacitor upper electrode layer formed on said capacitor insulating layer;

a second insulating layer formed on said first insulating layer and said capacitor upper electrode layer, a second contact hole formed in said second and first insulating layers and leading to said first impurity region;

a first wiring layer, formed on said second insulating layer and connected via said second contact hole to said first impurity region;

a third insulating layer formed on said first wiring layer and said second insulating layer, a third contact hole formed in said third and second insulating layers and leading to said capacitor upper electrode layer; and a second wiring layer, being formed on said third insulating layer and connected via said third contact hole to said capacitor upper electrode layer, said third contact hole being formed simultaneously with at least one other contact hole which do not lead to said first and second impurity doped regions;

wherein a single electrode layer constitutes both said capacitor upper electrode layer and a dummy capacitor upper electrode.

2. A device as set forth in claim 1, wherein said capacitor upper electrode layer extends beneath said third contact hole.

3. A device as set forth in claim 1, wherein said capacitor insulating layer is made of high permittivity material, and said capacitor upper electrode layer is made of a single high melting temperature material layer.

4. A device as set forth in claim 3, wherein said high permittivity material is one of $Ta_2O_5$, BST and PZT, and said high melting temperature material is one of TiN, WN and W.

5. A semiconductor memory device including a plurality of memory cells each including a transistor and a stacked capacitor, said device comprising:

at least two insulating layers formed on an upper electrode layer of said stacked capacitor, a contact hole formed in said at least two insulating layers and leading to said upper electrode layer; and a wiring layer formed on said at least two insulating layers and connected via said contact hole to said upper electrode layer, said contact hole being formed simultaneously with at least one other contact hole formed in one of said insulating layers;

wherein a single layer constitutes both the upper electrode layer of said stacked capacitor and an upper electrode of a dummy stacked capacitor.

6. A device as set forth in claim 5, wherein said upper electrode layer extends beneath said contact hole.

7. A device as set forth in claim 5, wherein said stacked capacitor includes a lower electrode, an insulating layer and said upper electrode layer, said insulating layer being made of high permittivity material, and said upper electrode layer is made of a single high melting temperature material layer.

8. A device as set forth in claim 7, wherein said high permittivity material is one of $Ta_2O_5$, BST and PZT, and said high melting temperature material is one of TiN, WN and W.

9. A stacked capacitor type semiconductor memory device comprising:

a semiconductor substrate;

first and second impurity doped regions formed within said semiconductor substrate;

a first insulating layer, formed on said semiconductor substrate and having a first contact hole leading to said second impurity doped region;

a capacitor lower electrode layer, formed on said first insulating layer and connected via said first contact hole to said second impurity doped region;

a dummy capacitor lower electrode layer formed on said first insulating layer;

a capacitor insulating layer formed on said capacitor lower electrode layer and said dummy capacitor lower electrode layer;

a capacitor upper electrode layer formed on said capacitor insulating layer;

a second insulating layer formed on said first insulating layer and said capacitor upper electrode layer, a second contact hole formed in said second and first insulating layers and leading to said first impurity region;

a first wiring layer, formed on said second insulating layer and connected via said second contact hole to said first impurity region;

a third insulating layer formed on said first wiring layer and said second insulating layer, a third contact hole formed in said third and second insulating layers and leading to said capacitor upper electrode layer over said dummy capacitor lower electrode layer; and a second wiring layer, formed on said third insulating layer and connected via said third contact hole to said capacitor upper electrode layer, said third contact hole being formed simultaneously with at least one other contact hole connecting said capacitor electrode layers and said wiring layers;

wherein a single upper electrode layer constitutes both said capacitor upper electrode layer and a dummy capacitor upper electrode.

10. A semiconductor memory device including a plurality of memory cells each including a transistor and a stacked capacitor, said device comprising:

at least two insulating layers formed on an upper electrode layer of said stacked capacitor, a contact hole formed in said at least two insulating layers and leading to said upper electrode layer;

a wiring layer formed on said at least two insulating layers and connected via said contact hole to said upper electrode layer, said contact hole being formed simultaneously with at least one other contact hole formed in one of said insulating layers; and a dummy stacked capacitor having an upper electrode in common with said stacked capacitor and connected via said contact hole to said wiring layer;

wherein a single upper electrode layer constitutes both the upper electrode of the dummy stacked capacitor and the upper electrode layer of said stacked capacitor.

* * * * *